(12) United States Patent
Morita et al.

(10) Patent No.: US 9,793,093 B2
(45) Date of Patent: Oct. 17, 2017

(54) SYSTEM FOR MANUFACTURING SEMICONDUCTOR DEVICE

(71) Applicant: Mitsubishi Electric Corporation, Tokyo (JP)

(72) Inventors: Daisuke Morita, Tokyo (JP); Hiroyuki Kawahara, Tokyo (JP); Shinji Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/185,166

(22) Filed: Jun. 17, 2016

(65) Prior Publication Data
US 2016/0300691 A1    Oct. 13, 2016

Related U.S. Application Data

(62) Division of application No. 14/497,393, filed on Sep. 26, 2014, now Pat. No. 9,397,474.

(30) Foreign Application Priority Data

Jan. 10, 2014    (JP) .................................. 2014-003379

(51) Int. Cl.
*H01L 21/00*    (2006.01)
*H01J 37/304*    (2006.01)
(Continued)

(52) U.S. Cl.
CPC ........ *H01J 37/304* (2013.01); *H01J 37/3026* (2013.01); *H01J 37/3053* (2013.01);
(Continued)

(58) Field of Classification Search
CPC .......... H01J 37/3053; H01J 2237/3174; H01S 5/34306; H01S 5/00; H01L 33/00
(Continued)

(56) References Cited

U.S. PATENT DOCUMENTS 5,347,356 A * 9/1994 Ota ..................... G03F 7/70633
                                                          356/401
5,436,195 A * 7/1995 Kimura ................. H01S 5/0265
                                                          117/902
(Continued)

FOREIGN PATENT DOCUMENTS

JP    7-38204 A    2/1995
JP    8-94981 A    4/1996
(Continued)

OTHER PUBLICATIONS

Korean Patent Office; Office Action in Korean Patent Application No. 10-2015-0000025 (dated Mar. 22, 2016).
(Continued)

*Primary Examiner* — Tuan Nguyen
(74) *Attorney, Agent, or Firm* — Leydig Voit and Mayer

(57) ABSTRACT

A semiconductor device manufacturing system includes: a PL evaluation apparatus that evaluates wavelengths of photoluminescent light produced by individual optical modulators on a single semiconductor wafer; an electron beam drawing apparatus that draws patterns of diffraction gratings of laser sections that adjoin respective optical modulators on the wafer; and a calculation section that receives the wavelengths of the photoluminescent light from the PL evaluation apparatus, calculates densities of respective diffraction gratings so that differences between the wavelengths of the photoluminescent light and oscillating wavelengths of the laser sections become a constant, and sends the densities calculated to the electron beam drawing apparatus for drawing respective diffraction grating patterns on the respective laser sections.

1 Claim, 2 Drawing Sheets

(51) Int. Cl.
    *H01S 5/0625*    (2006.01)
    *H01S 5/343*    (2006.01)
    *H01S 5/40*    (2006.01)
    *H01S 5/00*    (2006.01)
    *H01J 37/305*    (2006.01)
    *H01S 5/026*    (2006.01)
    *H01S 5/12*    (2006.01)
    *H01J 37/302*    (2006.01)
    *H01S 5/30*    (2006.01)

(52) U.S. Cl.
    CPC ........ *H01J 37/3056* (2013.01); *H01S 5/0014* (2013.01); *H01S 5/0265* (2013.01); *H01S 5/06256* (2013.01); *H01S 5/12* (2013.01); *H01S 5/3434* (2013.01); *H01S 5/34313* (2013.01); *H01S 5/34326* (2013.01); *H01S 5/4087* (2013.01); *H01J 2237/24585* (2013.01); *H01J 2237/30472* (2013.01); *H01J 2237/3174* (2013.01); *H01S 5/3054* (2013.01); *H01S 5/34306* (2013.01); *H01S 2301/173* (2013.01)

(58) Field of Classification Search
    USPC .................................................... 438/22, 32
    See application file for complete search history.

(56) References Cited

U.S. PATENT DOCUMENTS

| | | | |
|---|---|---|---|
| 5,459,747 A | 10/1995 | Takiguchi et al. | |
| 5,682,239 A * | 10/1997 | Matsumoto | G03F 9/70 |
| | | | 250/548 |
| 5,953,359 A * | 9/1999 | Yamaguchi | H01S 5/0265 |
| | | | 372/23 |
| 6,351,479 B1 | 2/2002 | Mori et al. | |
| 6,542,525 B1 | 4/2003 | Matsumoto et al. | |
| 2001/0005391 A1* | 6/2001 | Sakata | H01S 5/02 |
| | | | 372/50.11 |
| 2001/0019568 A1* | 9/2001 | Sakata | H01S 5/0265 |
| | | | 372/50.1 |
| 2004/0179569 A1 | 9/2004 | Sato et al. | |
| 2007/0291809 A1 | 12/2007 | Shiota et al. | |
| 2008/0037605 A1 | 2/2008 | Yamatoya et al. | |
| 2013/0183784 A1 | 7/2013 | Katsuyama et al. | |

FOREIGN PATENT DOCUMENTS

| | | |
|---|---|---|
| JP | 8-153928 A | 6/1996 |
| JP | 11-330605 A | 11/1999 |
| JP | 2000-150925 A | 5/2000 |
| JP | 2001-91913 A | 4/2001 |
| JP | 2004-109594 A | 4/2004 |
| JP | 2007-201072 A | 8/2007 |
| JP | 2007-335804 A | 12/2007 |

OTHER PUBLICATIONS

Letal, G. et al.; "Integrated Distributed Feedback Lasers and Electroabsorption Modulators Fabricated Using Helium-Plasma-Assisted InP Defect Induced Quantum Well Intermixing", *PhD. Thesis, McMaster University*, (Apr. 27, 2000).
Chinese Patent Office; Office Action in Chinese Patent Application No. 2015-10011808.4, dated May 4, 2017, 9 pages.
Japanese Patent Office; Office Action in Japanese Patent Application No. 2014-003379, dated May 23, 2017, 6 pages.
Japanese Office Action dated Aug. 15, 2017 in corresponding Japanese Patent Application No. 2014-003379, 4 pages.

* cited by examiner ized. A method for manufacturing a semiconductor device, the semiconductor device and a system for manufacturing the semiconductor device according to embodiments of the

SYSTEM FOR MANUFACTURING SEMICONDUCTOR DEVICE

BACKGROUND OF THE INVENTION

Field of the Invention

The present invention relates to a method for manufacturing a semiconductor device used, for example, for a light source of optical fiber communication, the semiconductor device manufactured using the manufacturing method and a system for manufacturing the semiconductor device.

Background Art

Japanese Patent Laid-Open No. 2001-91913 discloses a semiconductor device in which a laser section including an active layer and an optical modulator including a light absorption layer are monolithically formed. This semiconductor device is manufactured, for example, by forming an optical waveguide of the optical modulator first and then forming an optical waveguide of the laser section using a butt joint method.

To obtain a satisfactory current-optical output characteristic and high frequency characteristic, the difference value between a photoluminescence wavelength of the optical modulator and an oscillating wavelength of the laser section preferably has a predetermined value. An ideal difference value is determined in consideration of various characteristics.

As disclosed in Japanese Patent Laid-Open No. 2001-91913, by forming the optical modulator before the laser section, the optical modulator can be formed on a flat surface. This has an effect of making uniform the composition of the light absorption layer and stabilizing the photoluminescence wavelength of the optical modulator. However, there may be a case where a tolerable variation from the ideal difference value is only ±2 nm. In this case, the method disclosed in Japanese Patent Laid-Open No. 2001-91913 alone cannot reduce the variation in the difference value sufficiently.

SUMMARY OF THE INVENTION

The present invention has been implemented to solve the above-described problem and it is an object of the present invention to provide a method for manufacturing a semiconductor device, the semiconductor device and a system for manufacturing the semiconductor device capable of sufficiently reducing a variation in a difference value.

The features and advantages of the present invention may be summarized as follows.

According to one aspect of the present invention, a method for manufacturing a semiconductor device, includes a first step of forming a lower light confinement layer on a substrate, a light absorption layer on the lower light confinement layer and an upper light confinement layer on the light absorption layer and removing parts of the lower light confinement layer, the light absorption layer and the upper light confinement layer to thereby form an optical modulator, a second step of forming a laser section having a diffraction grating in a portion of the substrate where the optical modulator is not formed, a step of forming a diffusion constraining layer that constrains diffusion of a dopant on the upper light confinement layer, and a third step of forming a contact layer on the laser section and the diffusion constraining layer. The same type of dopant is used for the contact layer and the upper light confinement layer.

According to another aspect of the present invention, a method for manufacturing a semiconductor device includes a first step of forming a lower light confinement layer on a wafer, a light absorption layer on the lower light confinement layer and an upper light confinement layer on the light absorption layer and removing parts of the lower light confinement layer, the light absorption layer and the upper light confinement layer to thereby form a plurality of optical modulators, an evaluation step of evaluating photoluminescence wavelengths of individual optical modulators of the plurality of optical modulators, a second step of forming a plurality of laser sections on the wafer so that the laser sections each having a diffraction grating are connected to the plurality of optical modulators respectively, and a third step of forming a contact layer on the plurality of optical modulators and the plurality of laser sections. In the second step, the individual diffraction gratings of the plurality of laser sections are formed so that difference values between the photoluminescence wavelength obtained in the evaluation step and the oscillating wavelengths of the laser sections become predetermined values.

According to another aspect of the present invention, a semiconductor device includes a substrate, an optical modulator having a lower light confinement layer formed on the substrate, a light absorption layer formed on the lower light confinement layer and an upper light confinement layer formed on the light absorption layer, a diffusion constraining layer that constrains diffusion of a dopant formed on the upper light confinement layer, a laser section formed on the substrate so as to adjoin the optical modulator, and a contact layer formed on the laser section and the diffusion constraining layer. The light absorption layer has a uniform overall composition, and the same type of dopant is used for the contact layer and the upper light confinement layer.

According to another aspect of the present invention, a semiconductor device manufacturing system includes a PL evaluation apparatus that evaluates photoluminescence wavelengths of individual optical modulators of a plurality of optical modulators formed on a wafer, an electron beam drawing apparatus that forms diffraction gratings of laser sections provided so as to adjoin the plurality of optical modulators, and a calculation section that receives information of the photoluminescence wavelengths from the PL evaluation apparatus, calculates densities of the diffraction gratings so that difference values between the photoluminescence wavelengths and oscillating wavelengths of the laser sections become predetermined values and sends the result to the electron beam drawing apparatus.

Other and further objects, features and advantages of the invention will appear more fully from the following description.

DETAILED DESCRIPTION OF THE PREFERRED EMBODIMENTS

Figure 1:
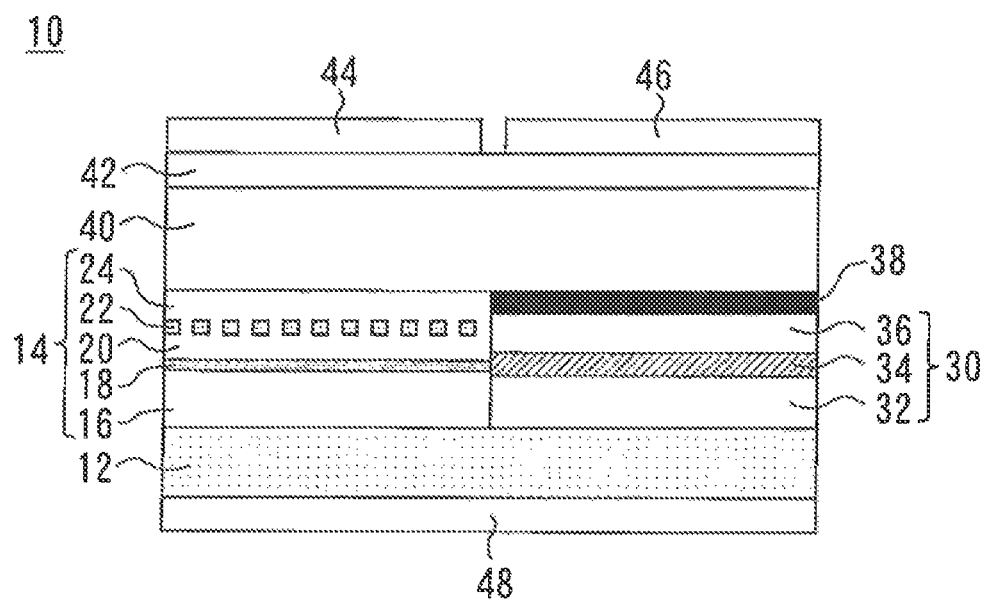
FIG. 1 is a cross-sectional view of a semiconductor device according to a first embodiment.

A method for manufacturing a semiconductor device, the semiconductor device and a system for manufacturing the semiconductor device according to embodiments of the present invention will be described with reference to the accompanying drawings. The same or corresponding components will be assigned the same reference numerals and duplicate description may be omitted.

First Embodiment

FIG. 1 is a cross-sectional view of a semiconductor device 10 according to a first embodiment of the present invention. The semiconductor device 10 is provided with a substrate 12 made of, for example, n-type InP. A laser section 14 is formed on the substrate 12. The laser section 14 will be described. The laser section 14 is provided with an n-type clad layer 16 formed on the substrate 12. An active layer 18 which is a MQW (Multi Quantum Well) made, for example, of InGaAsP is formed on the n-type clad layer 16. A p-type clad layer 20 is formed on the active layer 18. A diffraction grating 22 is formed on the p-type clad layer 20. A p-type embedded layer 24 is formed on the p-type clad layer 20.

An optical modulator 30 adjoining to the laser section 14 is formed on the substrate 12. The optical modulator 30 will be described. The optical modulator 30 is provided with a lower light confinement layer 32 formed on the substrate 12. The lower light confinement layer 32 is doped, for example, with S. A light absorption layer 34 is formed on the lower light confinement layer 32. The light absorption layer 34 as a whole has a uniform composition. The light absorption layer 34 is formed, for example, of an MQW made of InGaAsP. The light absorption layer 34 is not doped with any dopant. An upper light confinement layer 36 is formed on the light absorption layer 34. The upper light confinement layer 36 is doped with Be.

A diffusion constraining layer 38 is formed on the upper light confinement layer 36. The diffusion constraining layer 38 is made, for example, of i-type InP. A contact layer 40 is formed on the laser section 14 and the diffusion constraining layer 38. The contact layer 40 is doped with Be. Therefore, the type of dopant (Be) of the contact layer 40 is the same as the type of dopant (Be) of the upper light confinement layer 36.

An insulating film 42 is formed on the contact layer 40. A first p-side electrode 44 used as a p-side electrode of the laser section 14 and a second p-side electrode 46 used as a p-side electrode of the optical modulator 30 are formed on the insulating film 42. A common n-side electrode 48 is formed on the back of the substrate 12.

The semiconductor device 10 is an apparatus in which the laser section 14 and the optical modulator 30 are monolithically formed. The output light of the CW (continuous wave) driven laser section 14 is absorbed by the light absorption layer 34 of the RF (radio frequency) driven optical modulator 30, and it is thereby possible to realize fast response, large-volume transmission and long-distance communication.

Figure 2:
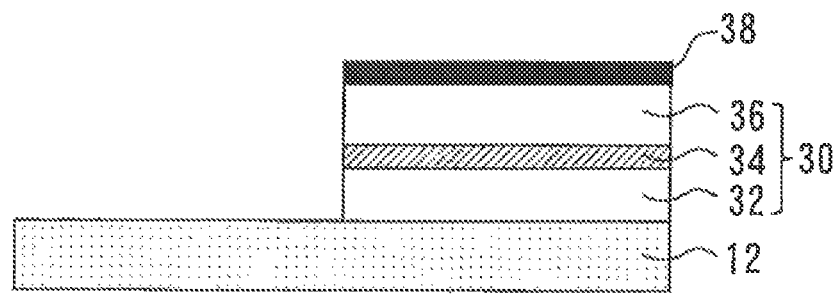
FIG. 2 shows a semiconductor device in which an optical modulator is formed.

The method of manufacturing the semiconductor device 10 will be described. First, the optical modulator 30 is formed. The step of forming the optical modulator 30 is called a "first step." In the first step, the lower light confinement layer 32, the light absorption layer 34 on the lower light confinement layer 32, and the upper light confinement layer 36 on the light absorption layer 34 are formed on the whole surface of the substrate 12 by means of epitaxial growth. Then, a mask is formed and part of the lower light confinement layer 32, the light absorption layer 34, and the upper light confinement layer 36 is removed by means of dry etching or wet etching. In this way, the lower light confinement layer 32, the light absorption layer 34 and the upper light confinement layer 36 shown in FIG. 2 are formed. The upper light confinement layer 36 is doped with Be. Then, the diffusion constraining layer 38 is formed on the upper light confinement layer 36 and the structure shown in FIG. 2 is completed. Note that the lower light confinement layer, the light absorption layer, the upper light confinement layer and the diffusion constraining layer may be formed on the entire surface of the substrate 12 and etched to complete the structure shown in FIG. 2 or the diffusion constraining layer 38 may be formed after the second step.

Figure 3:
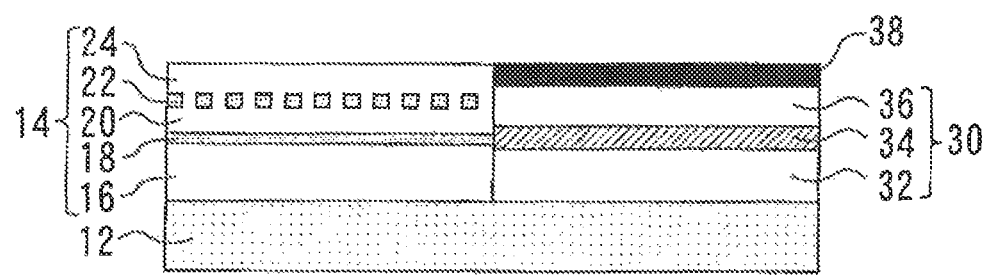
FIG. 3 shows a semiconductor device in which a laser section is formed.

Next, the laser section 14 is formed. The step of forming the laser section 14 is called a "second step". In the second step, the laser section 14 including the diffraction grating 22 is formed in a portion of the substrate 12 where the optical modulator 30 is not formed. The diffraction grating 22 is formed by forming a pattern in the p-type clad layer 20 using an electron beam drawing apparatus, forming periodic steps by means of etching and embedding a crystal having a refractive index different from that of the p-type clad layer 20 into the steps. FIG. 3 shows a cross-sectional view of the semiconductor device after the second step. The optical modulator 30, the diffusion constraining layer 38 and the laser section 14 are preferably formed using a butt joint method.

Next, the contact layer 40 is formed on the laser section 14 and the diffusion constraining layer 38. The step of forming the contact layer 40 is called a "third step." The contact layer 40 is doped with Be.

In the method for manufacturing a semiconductor device according to the first embodiment of the present invention, the optical modulator 30 is formed before forming the laser section 14, the same type of dopant (Be) is used for the contact layer 40 and the upper light confinement layer 36 and the diffusion constraining layer 38 is formed. All of these are intended to set the photoluminescence wavelength of the optical modulator 30 to a predetermined value (first predetermined value).

If the optical modulator is formed after the formation of the laser section, the composition of the portion adjoining the laser section of the light absorption layer deteriorates. This prevents the photoluminescence wavelength of the optical modulator from being set to the first predetermined value. Thus, the first embodiment of the present invention forms the optical modulator 30 before forming the laser section 14 to allow the optical modulator 30 to be formed on the flat surface of the substrate 12 without any side of the laser section 14. Compared to the case where the laser section is formed before forming the optical modulator, it is possible to make uniform the composition of the light absorption layer 34, and thereby set the photoluminescence wavelength of the optical modulator 30 to the first predetermined value.

In the first embodiment of the present invention, heat produced when the laser section 14 and the contact layer 40 are formed affects the optical modulator 30. Thus, the p-type dopant (e.g., Zn, Be) of the contact layer or the like may be diffused into the light absorption layer 34. When the p-type dopant is diffused from outside the light absorption layer to the light absorption layer, the photoluminescence wavelength of the optical modulator deviates from the first predetermined value.

Thus, in the first embodiment of the present invention, the same type of dopant (Be) is used for the contact layer 40 and the upper light confinement layer 36. This can prevent the dopant of the contact layer 40 from being diffused into the light absorption layer 34. Furthermore, it is also preferable to use the same type of dopant for the p-type clad layer 20 and the p-type embedded layer 24 as the dopant for the upper light confinement layer 36 so as to prevent the dopant of the p-type clad layer 20 and the p-type embedded layer 24 from being diffused into the light absorption layer 34.

The diffusion constraining layer 38 can suppress diffusion of the dopant from the contact layer 40 to the optical modulator 30. When the diffusion constraining layer 38 is too thin, diffusion of the p-type dopant cannot be suppressed, whereas when the diffusion constraining layer 38 is too thick, an electric field for driving the optical modulator 30 cannot be applied. Therefore, the diffusion constraining layer 38 preferably has an optimum thickness that suppresses diffusion of the p-type dopant and allows a sufficient electric field to be applied to the optical modulator 30. For example, the thickness of the diffusion constraining layer 38 is preferably set to within a range of 100 to 400 nm and concentration of the dopant of the diffusion constraining layer is preferably set to $\leq 1E+16$ cm$^{-3}$.

Using the same type of dopant for the contact layer 40 and the upper light confinement layer 36 and forming the diffusion constraining layer 38 contribute not only to stabilization of the photoluminescence wavelength of the optical modulator 30, but mainly to stabilization of the amount of light absorption. Therefore, according to the semiconductor device 10, it is possible to stabilize the amount of light absorption while stabilizing the photoluminescence wavelength of the optical modulator 30 to the first predetermined value.

The oscillating wavelength of the laser section 14 is determined by spacing of the diffraction grating 22. Since the diffraction grating 22 is formed using an electron beam drawing apparatus, it is easy to set the oscillating wavelength of the laser section 14 to a predetermined value (second predetermined value).

Thus, according to the method for manufacturing a semiconductor device according to the first embodiment of the present invention, it is possible to set the photoluminescence wavelength of the optical modulator 30 to the first predetermined value and set the oscillating wavelength of the laser section 14 to the second predetermined value. This makes it possible to sufficiently reduce a variation in the difference value between the photoluminescence wavelength and the oscillating wavelength.

When an InP-based material such as InGaAsP is used for the light absorption layer 34, the contact layer 40 and the upper light confinement layer 36 are preferably doped with Be. When an Al-based material such as AlGaInAs is used for the light absorption layer, the contact layer and the upper light confinement layer 36 are preferably doped with Zn. The diffraction grating 22 may be formed in the n-type clad layer 16. These modifications are applicable to a method for manufacturing a semiconductor device according to the following embodiment.

Second Embodiment

Figure 4:
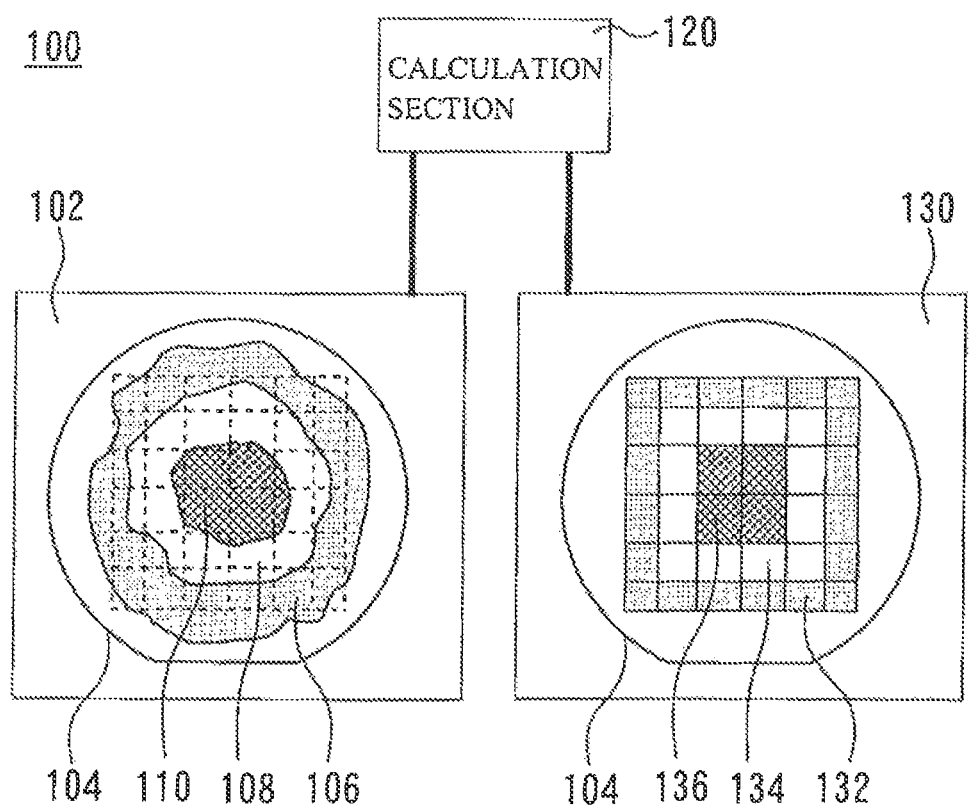
FIG. 4 is a diagram illustrating a semiconductor device manufacturing system according to the second embodiment.

A second embodiment will be described focusing on differences from the first embodiment. The second embodiment relates to a method for manufacturing a semiconductor device and a semiconductor device manufacturing system whereby a plurality of semiconductor devices are manufactured on one wafer. FIG. 4 is a diagram illustrating a semiconductor device manufacturing system 100 according to the second embodiment of the present invention. The semiconductor device manufacturing system 100 (hereinafter simply referred to as "system 100") is provided with a PL evaluation apparatus 102. A calculation section 120 is connected to the PL evaluation apparatus 102. An electron beam drawing apparatus 130 is connected to the calculation section 120. The electron beam drawing apparatus 130 is an apparatus that draws a diffraction grating of the laser section, provided so as to adjoin each of a plurality of optical modulators.

The method for manufacturing a semiconductor device according to the second embodiment will be described. First, the lower light confinement layer, the light absorption layer, and the upper light confinement layer are formed in a wafer 104, and parts of these layers are removed to form a plurality of optical modulators. This step is a first step.

After the first step, photoluminescence wavelengths of individual optical modulators of the plurality of optical modulators formed on the wafer 104 are evaluated using the PL evaluation apparatus 102. This step is called an "evaluation step." In the evaluation step, the wafer 104 is moved to the PL evaluation apparatus 102 and photoluminescence wavelengths of 36 optical modulators formed on the wafer are measured. The 36 optical modulators are formed, one for each region enclosed by a broken line.

A distribution of photoluminescence wavelengths within the surface of the wafer is shown on the wafer 104 of the PL evaluation apparatus 102. The photoluminescence wavelength at a peripheral part 106 has is $\lambda 1$. The photoluminescence wavelength at an intermediate part 108 inside the peripheral part 106 is $\lambda 2$ which is greater than $\lambda 1$. The photoluminescence wavelength at a central part 110 inside the intermediate part 108 is $\lambda 3$ which is greater than $\lambda 2$. That is, the photoluminescence wavelength decreases toward the outer circumferential side of the wafer 104. Data of photoluminescence wavelengths is transmitted to the calculation section 120.

After the evaluation step, the process moves to a second step. In the second step, a plurality of laser sections are formed on the wafer so that laser sections each having a diffraction grating are connected to a plurality of optical modulators. The individual diffraction gratings of the plurality of laser sections are formed so that the difference value between the photoluminescence wavelength obtained in the evaluation step and the oscillating wavelength of the laser section becomes a predetermined value.

Specific processing will be described. First, the calculation section 120 receives information of photoluminescence wavelengths from the PL evaluation apparatus 102 and calculates a density of the diffraction grating so that the difference value between the photoluminescence wavelength and the oscillating wavelength of the laser section becomes a predetermined value. That is, an optimum density of the diffraction grating is calculated for the individual optical modulators. Note that the "density of the diffraction grating" represents number of diffraction grating cycles per unit length of a diffraction grating pattern. If the density of the diffraction grating is increased, the oscillating wavelength of the laser element decreases and if the density of the diffraction grating is decreased, the oscillating wavelength of the laser element increases.

Since the photoluminescence wavelength of the optical modulator at the wafer central part 110 is large, the density of the diffraction grating is decreased so as to set the difference value to a predetermined value. On the other hand, since the photoluminescence wavelength of the optical modulator at the peripheral part 106 is small, the density of the diffraction grating is increased so as to set the difference value to a predetermined value. The calculated result is then sent to the electron beam drawing apparatus 130.

The electron beam drawing apparatus 130 radiates an electron beam onto the wafer 104 to form the diffraction grating based on calculation results of the calculation section 120. That is, the density of the diffraction grating is increased at a peripheral part 132 of the wafer, the density of the diffraction grating is decreased at an intermediate part 134 compared to the peripheral part 132 and the density of the diffraction grating is decreased at a central part 136 compared to the intermediate part 134.

Next, the contact layer is formed on the plurality of optical modulators and the plurality of laser sections. This step is a third step. Thus, 36 semiconductor devices are formed which have diffraction gratings optimized from the viewpoint of the difference value.

As described above, the photoluminescence wavelength has a certain variation within the surface of the wafer. Thus, when diffraction gratings of all semiconductor devices within the surface of the wafer are formed with uniform spacing, the difference value between the photoluminescence wavelength and the oscillating wavelength of the laser sections varies within the surface of the wafer. As a result, a semiconductor device is formed which has a difference value deviated from a predetermined difference value.

However, according to the method for manufacturing a semiconductor device using the system 100 according to the second embodiment of the present invention, an optimum diffraction grating is formed so that the difference value is set to a predetermined value in each semiconductor device based on the photoluminescence wavelength obtained in the evaluation step. Thus, the difference values can be set to predetermined values for all of the 36 semiconductor devices formed on the wafer.

The features of the first embodiment and the features of the second embodiment may be combined as appropriate. For example, in the method for manufacturing a semiconductor device according to the second embodiment, if the same type of dopant is used for the contact layer and the upper light confinement layer and a diffusion constraining layer is formed, it is possible to enhance the effect of reducing a variation of the difference value.

According to the present invention, it is possible to prevent diffusion of the dopant into the light absorption layer, optimize the density of the diffraction grating and thereby reduce a variation of the difference value.

Obviously many modifications and variations of the present invention are possible in the light of the above teachings. It is therefore to be understood that within the scope of the appended claims the invention may be practiced otherwise than as specifically described.

What is claimed is:

1. A semiconductor device manufacturing system comprising:
a PL evaluation apparatus that evaluates wavelengths of photoluminescent light produced by individual optical modulators of a plurality of optical modulators on a wafer;
an electron beam drawing apparatus that draws patterns of diffraction gratings of laser sections adjoining respective optical modulators of the plurality of optical modulators; and
a calculation section that receives the wavelengths of the photoluminescent light from the PL evaluation apparatus, calculates densities of respective diffraction gratings so that difference values between the wavelengths of the photoluminescent light and oscillating wavelengths of the laser sections become predetermined values, and sends the densities calculated to the electron beam drawing apparatus for drawing respective diffraction grating patterns on the respective laser sections.

* * * * *